(12) United States Patent
Wang et al.

(10) Patent No.: US 9,647,866 B2
(45) Date of Patent: May 9, 2017

(54) RF TRANSMITTER, INTEGRATED CIRCUIT DEVICE, WIRELESS COMMUNICATION UNIT AND METHOD THEREFOR

(75) Inventors: Hua Wang, San Francisco, CA (US); Chao Lu, Fremont, CA (US); Julia Liu, San Jose, CA (US); Chun-Hsien Peng, Nantou County (TW); Sang Won Son, Palo Alto, CA (US); Paul Cheng Po Liang, Hsinchu County (TW)

(73) Assignee: MediaTek Singapore PTE, Ltd., Solaris (SG)

( * ) Notice: Subject to any disclaimer, the term of this patent is extended or adjusted under 35 U.S.C. 154(b) by 182 days.

(21) Appl. No.: 13/298,282

(22) Filed: Nov. 16, 2011

(65) Prior Publication Data

US 2012/0269291 A1    Oct. 25, 2012

Related U.S. Application Data

(60) Provisional application No. 61/477,684, filed on Apr. 21, 2011, provisional application No. 61/500,900, filed on Jun. 24, 2011.

(51) Int. Cl.
| | |
|---|---|
| H04L 25/49 | (2006.01) |
| H04L 27/36 | (2006.01) |
| H04B 1/04 | (2006.01) |

(52) U.S. Cl.
CPC ......... *H04L 27/367* (2013.01); *H04B 1/0475* (2013.01); *H04B 2001/0425* (2013.01)

(58) Field of Classification Search
CPC .... H04B 2001/0425; H04B 2001/0408; H04B 1/62; H04B 2001/0416; H04B 1/0475;
(Continued)

(56) References Cited

U.S. PATENT DOCUMENTS

| 5,105,445 A | 4/1992 | Karam |
| 6,054,895 A | 4/2000 | Danielsons et al. |
(Continued)

FOREIGN PATENT DOCUMENTS

| CN | 1784879 A | 6/2006 |
| CN | 1819471 A | 8/2006 |
(Continued)

OTHER PUBLICATIONS

Pere Luis Gilabert Pinal, "Multi Look-Up Table Digital Predistortion for RF Power Amplifier Linearization", Chapter 5, PHD Thesis, Control Monitoring and Communications Group, Department of Signal Theory and Communications, Universitat Politecnica de Catalunya, Barcelona, Dec. 2007.*

(Continued)

*Primary Examiner* — Aristocratis Fotakis
(74) *Attorney, Agent, or Firm* — Optimus Patents US, LLC

(57) ABSTRACT

A radio frequency (RF) transmitter has at least one digital signal processing module and at least one power amplifier module. The digital signal processing module includes at least one digital pre-distortion component arranged to receive at least one complex input signal, perform two-dimensional non-uniform mapping of the complex input signal to a first, in-phase, digital pre-distortion control word and a further, quadrature, digital pre-distortion control word, and output the in-phase and quadrature pre-distortion digital control words. The power amplifier module includes a first, in-phase, array of switch-mode power cells and at least one further, quadrature, array of switch-mode power cells. The two-dimensional non-uniform mapping has a pre-distortion profile at least partly based on an input/output relationship for the power amplifier module arranged to generate an (Continued)

analog RF signal based at least partly on the in-phase and quadrature digital pre-distortion control words.

19 Claims, 4 Drawing Sheets

(58) Field of Classification Search
CPC .................. H04L 27/367; H04L 1/0042; H03F 2200/372; H03F 1/3294
See application file for complete search history.

(56) References Cited

U.S. PATENT DOCUMENTS

| | | | |
|---|---|---|---|
| 6,298,097 B1* | 10/2001 | Shalom | 375/297 |
| 6,697,436 B1 | 2/2004 | Wright | |
| 6,937,175 B1* | 8/2005 | Cruz-Albrecht et al. | 341/143 |
| 7,158,582 B2 | 1/2007 | Gamm | |
| 7,382,835 B2 | 6/2008 | Anvari | |
| 7,724,839 B2 | 5/2010 | Chen | |
| 7,826,553 B2 | 11/2010 | Chen | |
| 7,889,811 B2 | 2/2011 | Byun | |
| 2001/0050592 A1 | 12/2001 | Wright | |
| 2002/0085647 A1 | 7/2002 | Oishi | |
| 2003/0035494 A1 | 2/2003 | Bauder | |
| 2003/0179830 A1 | 9/2003 | Eidson | |
| 2004/0124916 A1* | 7/2004 | Kontson | 330/51 |
| 2006/0119493 A1 | 6/2006 | Tal | |
| 2006/0291589 A1 | 12/2006 | Eliezer | |
| 2007/0049219 A1* | 3/2007 | Demir et al. | 455/126 |
| 2007/0190952 A1* | 8/2007 | Waheed | H04B 1/0475 455/114.3 |
| 2008/0002788 A1 | 1/2008 | Akhtar | |
| 2008/0075194 A1* | 3/2008 | Ravi et al. | 375/297 |
| 2008/0187035 A1 | 8/2008 | Nakamura | |
| 2008/0278230 A1* | 11/2008 | Kost | H03F 1/30 330/10 |
| 2009/0004981 A1 | 1/2009 | Eliezer | |
| 2009/0051426 A1 | 2/2009 | Ba | |
| 2009/0054016 A1* | 2/2009 | Waheed et al. | 455/114.3 |
| 2009/0225903 A1* | 9/2009 | van Waasen | 375/316 |
| 2010/0073084 A1 | 3/2010 | Hur | |
| 2010/0074367 A1* | 3/2010 | Kim | H03F 1/0294 375/296 |
| 2010/0090745 A1 | 4/2010 | Kousai | |
| 2010/0105338 A1 | 4/2010 | Wang et al. | |
| 2010/0127780 A1 | 5/2010 | An | |
| 2011/0058622 A1* | 3/2011 | Liang | H04L 25/4917 375/286 |
| 2011/0080216 A1 | 4/2011 | Mujica | |
| 2011/0103508 A1 | 5/2011 | Mu | |
| 2011/0129037 A1* | 6/2011 | Staszewski et al. | 375/316 |
| 2011/0176636 A1 | 7/2011 | Wang | |
| 2011/0260797 A1 | 10/2011 | Lee | |
| 2012/0128092 A1* | 5/2012 | Lai | H04L 27/0008 375/295 |

FOREIGN PATENT DOCUMENTS

| | | |
|---|---|---|
| CN | 101036359 A | 9/2007 |
| CN | 101167324 A | 4/2008 |
| CN | 101478514 A | 7/2009 |
| JP | 200749621 A | 2/2007 |
| WO | 0025495 A1 | 5/2000 |
| WO | 0069065 A2 | 11/2000 |

OTHER PUBLICATIONS

Patrick Cruise, Chih-Ming Hung, Robert Bogdan Staszewskr, Oren Eliezer, Sameh Rezeq, Ken Maggio, and Dirk Leipold, "A Digital-to-RF-Amplitude Converter for GSMIGPRSEDGE in 90-nm Digital CMOS", Texas Instruments Inc, Dallas, TX, 2005, IEEE.*
Pere Lluis Gilabert Pinal "Multi Look-Up Table Digital Predistortion for RF Power Amplifier Linearization", Chapters 2 and 5, PHD Thesis, Control Monitoring and Communications Group, Department of Signal Theory and Communications, Universitat Politecnica de Catalunya, Barcelona, Dec. 2007.*
"International Search Report" mailed on May 17, 2012 for International application No. PCT/CN2012/071661, International filing date: Feb. 27, 2012.
"International Search Report" mailed Oct. 4, 2012 for International application No. PCT/CN2012/077358, International filing date: Jun. 21, 2012.
"International Search Report" mailed on Jul. 5, 2012 for International application No. PCT/CN2012/073413, International filing date: Mar. 31, 2012.
Robert Bogdan Staszewski, "All-Digital PLL and Transmitter for Mobile Phones", IEEE Journal of Solid-State Circuits, vol. 40, No. 12, Dec. 2005.
Mohammad. E. Heidari et al., "All-digital out-phasing modulator for a software-defined transmitter", 2008.
Hyun H. Boo et al., "Adaptive Predistortion Using a Delta-Sigma Modulator for Automatic Inversion of Power Amplifier Nonlinearity", 2009.
Debopriyo Chowdhury et al., "A 2.4GHz mixed-signal polar power amplifier with low-power integrated filtering in 65nm CMOS", 2010.
Calogero D. Presti et al., "A 25 dBm digitally modulated CMOS power amplifier for WCDMA/EDGE/OFDM with adaptive digital predistortion and efficient power control", 2009.
Petri Eloranta et al., "A multimode transmitter in 0.13 um CMOS using direct-digital RF modulator", IEEE Journal of Solid-State Circuits, vol. 42, No. 12, Dec. 2007.
Jaimin Mehta et al., "A 0.8mm2 All-Digital SAW-Less Polar Transmitter in 65nm EDGE SoC", ISSCC, p. 58-59, Figure 3.2.7, 2010.
Edward Gebara et al., "Integrated CMOS PA Technology for Cellular Digital Radios", Feb. 18, 2009.
Morteza S. Alavi, Akshay Visweswaran, Robert B. Staszewski, Leo C.N de Vreede, John R. Long, Atef Akhnoukh, "A 2-GHz Digital I/Q Modulator in 65-nm CMOS", Delft University of Technology, The Netherlands, IEEE Asian Solid-State Circuits Conference, Nov. 14-16, 2011, Jeju, Korea, 2011 IEEE, p. 277-280.
Hsin-Hung Chen, Chih-Hung Lin, Po-Chiun Huang, and Jiunn-Tsair Chen, "Joint Polynomial and Look-Up-Table Predistortion Power Amplifier Linearization", National Tsing Hua University, Taiwan, IEEE Transactions on circuits and systems_II: Express briefs, vol. 53, No. 8, Aug. 2006,2006 IEEE, p. 612-616.
Morteza S. Alavi, Robert Bogdan Staszewski, Leo C. N. de Vreede, Akshay Visweswaran, and John R. Long, "All-Digital RF I/Q Modulator", Delft University of Technology, The Netherlands, IEEE Transactions on microwave theory and techniques, vol. 60, No. 11, Nov. 2012,2012 IEEE, p. 3513-3526.
Chen et al., "Joint polynomial and look-up-table power amplifier linearization scheme," Vehicular Technology Conference, 2003. VTC 2003-Spring. The 57th IEEE Semiannual, pp. 1345-1349 vol. 2, Apr. 22-25, 2003.
USPTO Office Action for U.S. Appl. No. 13/351,209 mailed Oct. 22, 2015; pp. 1-12.

* cited by examiner

RF TRANSMITTER, INTEGRATED CIRCUIT DEVICE, WIRELESS COMMUNICATION UNIT AND METHOD THEREFOR

CROSS REFERENCE TO RELATED APPLICATIONS

This application claims the benefit of U.S. provisional application No. 61/477,684 (filed on Apr. 21, 2011) and U.S. provisional application No. 61/500,900 (filed on Jun. 24, 2011). The entire contents of the related applications are incorporated herein by reference.

BACKGROUND

The field of this invention relates to a radio frequency transmitter architecture, an integrated circuit device, a wireless communication unit and a method therefor. The invention is applicable to, but not limited to, a method of generating a radio frequency signal for transmission over a radio frequency (RF) interface.

Advances in the deep sub-micron CMOS (Complimentary Metal-Oxide Semiconductor) process have lead to digital circuits becoming smaller and more power efficient. However, it is known that analogue circuits do not scale particularly well with the deep sub-micron CMOS process. It is therefore desirable for devices, such as radio frequency (RF) transmitters, to remove as many analogue components or circuits as possible, for example with the assistance of digital signal processing algorithms, in order to be able to benefit from more use of deep sub-micron CMOS processes.

Furthermore, a large number of conventional RF transmitters use linear power amplifiers (PAs). Accordingly, the power efficiency of such conventional RF transmitters is usually very low, due to the low efficiency of the linear PAs used therein. Switch-mode PAs have very high efficiency in comparison, which make such switch-mode PAs an attractive alternative to conventional linear PAs within RF transmitters.

Thus, an RF transmitter that is able to utilize switch-mode PAs through the assistance of digital processing algorithms in order to reduce a PA's size and improve a PA's power efficiency is highly desirable. However, switch-mode PAs normally exhibit a highly non-linear input-output relationship. Furthermore, in order to meet stringent co-existence requirements of various wireless standards, noise shaping techniques are often required.

Digital polar transmitters are a type of known transmitter design that utilizes switch-mode PAs, whilst also taking advantage of CMOS process technology. Accordingly, such digital polar transmitters are able to achieve high power efficiency, whilst requiring only a small silicon area. However, a problem with these known transmitter designs is that, due to the inherent bandwidth expansion characteristics of the AM (amplitude modulation) and PM (phase modulation) signals in a polar architecture, they are only suitable for narrowband modulated signals.

Hybrid polar transmitter designs take advantage of two dimensional (in-phase/quadrature) modulation to enable wideband phase modulation to achieved. However, a problem with such hybrid polar transmitters is that they suffer from both amplitude and phase quantization noise, thus requiring significant noise shaping.

In-phase/Quadrature (IQ) RF digital-to-analogue converter (DAC) based transmitters are also known. I/Q RF DACs combine the functionalities of a DAC and a mixer, with the output of the I/Q RF DAC being combined in the analogue (RF) domain. However, such transmitter designs require a linear PA, and direct I/Q RF digital-to-analogue conversion is less power efficient than a digital polar transmitter design.

Another known (predominantly narrowband) RF transmitter design utilizes adaptive pre-distortion using a delta-sigma modulator for automatic inversion of power amplifier non-linearity. Such a design is relatively simple and allows for a use of low-precision DACs. However, this design still comprises a generally conventional architecture, and so PA efficiency is low.

It is anticipated that digitally-assisted/digitally-intensive RF transmitters will become increasingly desirable. However, digital algorithms are limited by the availability of circuit speed; therefore finding simple and effective digital algorithms is crucial from an implementation perspective. In published literature currently available there are sometimes discussions on digital algorithms that operate at very high clock frequencies, such as four times the carrier frequency. However, such clock frequencies are, in a practical CMOS and/or subscriber communication unit sense, not implementable.

Thus, a need exists for an improved RF transmitter, and method of operation therefor.

SUMMARY

Accordingly, the invention seeks to mitigate, alleviate or eliminate one or more of the above mentioned disadvantages singly or in any combination. Aspects of the invention provide a method for generating a radio frequency signal for transmission over a radio frequency interface.

According to a first aspect of the invention, there is provided a radio frequency (RF) transmitter comprising at least one digital signal processing module comprising at least one digital pre-distortion component arranged to receive at least one complex input signal comprising information to be transmitted over an RF interface, perform two-dimensional non-uniform mapping of the at least one received complex input signal to a first, in-phase digital pre-distortion control word and at least one further, quadrature digital pre-distortion control word, and to output the in-phase and quadrature digital pre-distortion control words. The RF transmitter further comprises at least one power amplifier module comprising a first, in-phase, array of switch-mode power cells and at least one further, quadrature array of switch-mode power cells, wherein the two-dimensional non-uniform mapping comprises a pre-distortion profile that is at least partly based on an input/output relationship for the at least one power amplifier module. The at least one power amplifier module is arranged to receive the in-phase and quadrature digital pre-distortion control words output by the at least one digital signal processing module, and to generate an analogue RF signal for transmission over an RF interface based at least partly on the in-phase and quadrature digital pre-distortion control words.

Thus, in this manner, the RF transmitter comprises a complex signal based architecture, i.e. an IQ based architecture, and as such is suitable for both narrowband and wideband modulation input signals. This is in contrast to, for example, a digital polar architecture which is only suitable for narrowband modulated signals due to the inherent bandwidth expansion characteristics of the AM (amplitude modulation) and PM (phase modulation) input signals of a polar architecture. Furthermore, such an IQ based architecture avoids the need for implementing complex algorithms, such as the CORDIC algorithm typically required for digital polar architectures. In addition, the RF transmitter also extends the digital domain through to the power amplifier module, thereby benefiting from the scalability and efficiency of digital components to a greater extent than conventional RF architectures. Furthermore, the RF transmitter takes advantage of the efficiency of switch-mode power cells. Further still, the two-dimensional non-uniform mapping of the input signals provides pre-distortion of the input signals, thereby enabling the non-linearity of the switch-mode power cells to be compensated for, also within the digital domain.

According to an optional feature of the invention, the at least one digital signal processing module may comprise at least one digital pre-distortion component arranged to receive the at least one complex input signal, perform two-dimensional non-uniform mapping of the at least one received complex input signal to a first, in-phase digital pre-distortion control word and at least one further, quadrature digital pre-distortion control word, and to output the in-phase and quadrature digital pre-distortion control words.

According to an optional feature of the invention, the at least one digital pre-distortion component may be arranged to receive the at least one complex input signal, identify a closest matching predefined vector for the received at least one complex input signal within a two-dimensional pre-distortion profile, and map the identified predefined vector to a set of digital control words to be output. For example, the two-dimensional pre-distortion profile may be at least partly based on an input/output relationship for the power amplifier module; in particular the two-dimensional pre-distortion profile may be at least partly based on an input/output relationship for the arrays of the switch-mode power cells of the power amplifier module.

According to an optional feature of the invention, the at least one digital signal processing module may comprise at least one noise shaping component arranged to receive the at least one complex input signal and at least one feedback signal from the at least one digital pre-distortion component, apply noise shaping to the at least one complex input signal based at least partly on the at least one feedback signal, and output at least one noise shaped complex input signal. For example, the at least one digital pre-distortion component may be arranged to receive the at least one noise shaped complex input signal, perform two-dimensional non-uniform mapping of the at least one noise shaped complex input signal to a first, in-phase digital pre-distortion control word and at least one further, quadrature digital pre-distortion control word, and to output the in-phase and quadrature digital pre-distortion control words.

According to an optional feature of the invention, the at least one noise shaping component and the at least one digital pre-distortion component may form at least part of a delta sigma modulator.

According to an optional feature of the invention, the at least one digital signal processing module may comprise an up-sampling component arranged to perform up-sampling of the received at least one complex input signal to increase a sample rate of the received at least one complex input signal to an input data rate of the at least one power amplifier module.

According to an optional feature of the invention, the first array of switch-mode power cells may be arranged to receive at least a part of the first, in-phase digital pre-distortion control word and to generate a first, in-phase component of the analogue RF signal based at least partly on the first, in-phase digital pre-distortion control word, and the at least one further, quadrature, array of switch-mode power cells may be arranged to receive the at least one further, quadrature digital pre-distortion control word and to generate at least one further quadrature, component of the analogue RF signal based at least partly on the at least one further, quadrature digital pre-distortion control word.

According to an optional feature of the invention, the first, in-phase, array of switch-mode power cells and the at least one further, quadrature, array of switch-mode power cells may be further arranged to receive respective carrier frequency signals, and to generate the respective first, in-phase, component and at least one further, quadrature, component of the analogue RF signal further based at least partly on the received carrier frequency signals.

According to an optional feature of the invention, the power amplifier module may comprises a first, in-phase, phase selector arranged to receive a carrier frequency signal and a first, in-phase, sign signal, and to output a first, in-phase, carrier frequency signal for the first, in-phase, array of switch-mode power cells; and at least one further, quadrature, phase selector arranged to receive a carrier frequency signal and at least one further, quadrature, sign signal, and to output at least one further, quadrature, carrier frequency signal for the at least one further, quadrature, array of switch-mode power cells.

According to an optional feature of the invention, the at least one power amplifier module may comprise a magnitude and sign generator module arranged to receive the digital pre-distortion control words output by the at least one digital signal processing module; and generate from each digital pre-distortion control word a magnitude control word comprising a magnitude component of the respective digital control word, and a sign signal comprising a sign component of the respective digital control word.

According to an optional feature of the invention, each array of switch-mode power cells may comprise a plurality of inverse Class D structure switch-mode power cells According to a second aspect of the invention, there is provided an integrated circuit device comprising a signal processing module comprising at least one digital pre-distortion component substantially according to the first aspect of the invention.

According to a third aspect of the invention, there is provided a wireless communication unit comprising a radio frequency transmitter according to the first aspect of the invention.

According to a fourth aspect of the invention, there is provided a method of generating a radio frequency signal for transmission over a radio frequency (RF) interface. The method comprises receiving at least one complex (in-phase/quadrature) input signal comprising information to be transmitted over the RF interface; performing two-dimensional non-uniform mapping of the at least one received complex input signal to a first, in-phase, digital pre-distortion control word and at least one further, quadrature, digital pre-distortion control word; providing the in-phase and quadrature digital pre-distortion control words to at least one power amplifier module comprising a first, in-phase, array of switch-mode power cells and at least one further quadrature, array of switch-mode power cells, wherein the two-dimensional non-uniform mapping comprises a pre-distortion profile that is at least partly based on an input/output relationship for the at least one power amplifier module; and generating an analogue RF signal for transmission over an RF interface based at least partly on the in-phase and quadrature digital control words.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

The present invention will now be described with reference to an example of a radio frequency (RF) transmitter for use within, say, a wireless telecommunication handset and adapted in accordance with some embodiments of the present invention. However, it will be appreciated that the inventive concept described herein is not limited to specific features of the illustrated example, and may equally be implemented within alternative applications.

Figure 1:
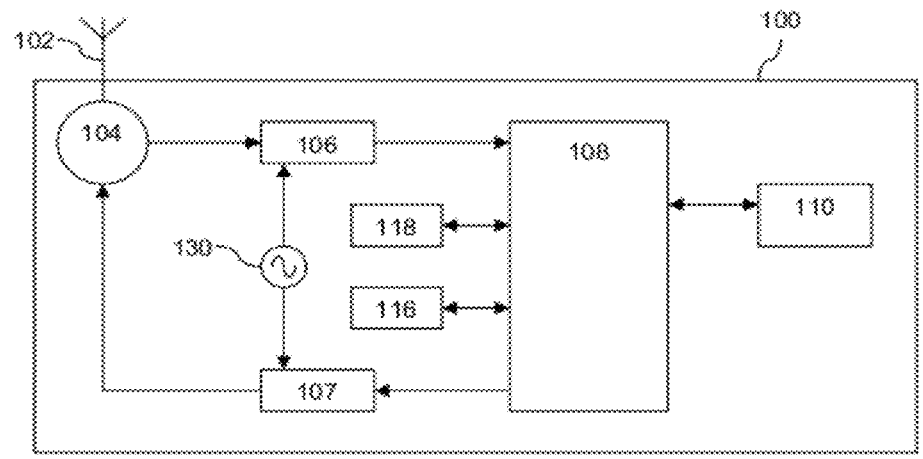
FIG. 1 illustrates an example of a simplified block diagram of part of an electronic device adapted to support the inventive concepts of an example of the present invention.

Referring first to FIG. 1, there is illustrated an example of a simplified block diagram of part of an electronic device 100 adapted to support the inventive concept of an example of the present invention. The electronic device 100, in the context of the illustrated embodiment of the invention, is a wireless telecommunication handset. As such, the electronic device 100 comprises an antenna 102 and contains a variety of well known radio frequency transceiver components or circuits operably coupled to the antenna 102. In particular for the illustrated example, the antenna 102 is operably coupled to a duplex filter or antenna switch 104 that provides isolation between a receiver chain 106 and a transmitter chain 107. As is known in the art, the receiver chain 106 typically includes radio frequency receiver circuitry for providing reception, filtering and intermediate or base-band frequency conversion. Conversely, the transmitter chain 107 typically includes radio frequency transmitter circuitry for providing modulation and power amplification. An oscillator 130 is arranged to provide oscillation signals needed by the receiver chain 106 and the transmitter chain 107.

For completeness, the electronic device 100 further comprises signal processing logic 108. An output from the signal processing logic 108 may be provided to a suitable user interface (UI) 110 comprising, for example, a display, keypad, microphone, speaker, etc. The signal processing logic 108 may also be coupled to a memory element 116 that stores operating regimes, such as decoding/encoding functions and the like and may be realised in a variety of technologies, such as random access memory (RAM) (volatile), (non-volatile) read only memory (ROM), Flash memory or any combination of these or other memory technologies. A timer 118 is typically coupled to the signal processing logic 108 to control the timing of operations within the electronic device 100.

As is well known in the art, the transmitter chain 107 of such a wireless telecommunication handset comprises transmitter circuitry arranged to receive an input signal, for example from, in the illustrated example, the signal processing logic 108; the input signal comprising information to be transmitted over an RF interface. The transmitter chain 107 is further arranged to output an RF signal comprising the information to be transmitted to, in the illustrated example, the antenna 102 via the antenna switch 104. As such, the transmitter chain 107 is typically required to perform digital to analogue conversion, mixing, noise shaping and amplification of the input signal in order to generate the RF signal output thereby.

Figure 2:
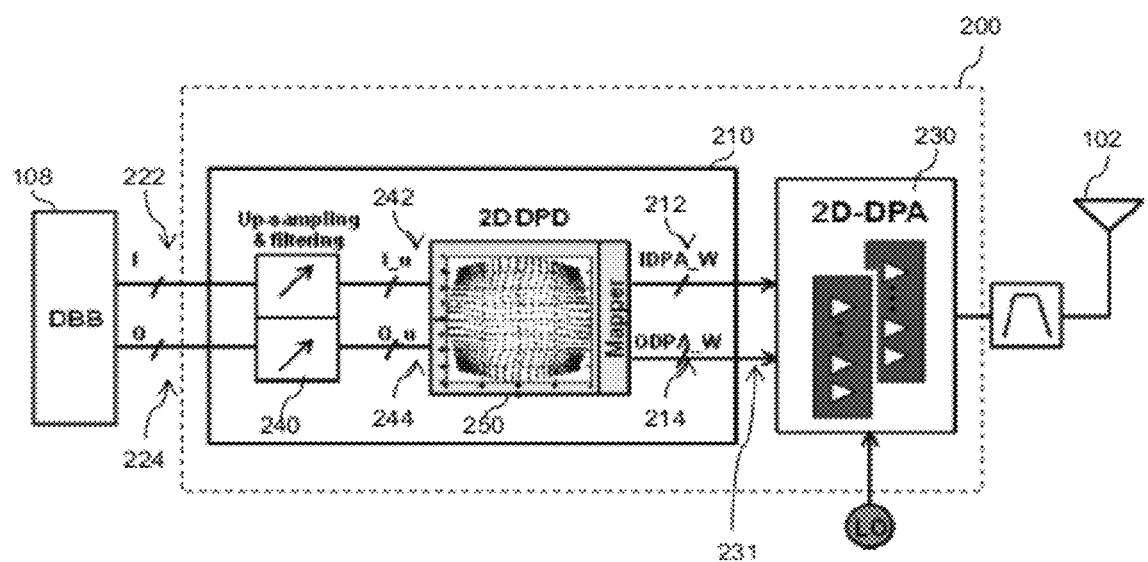
FIG. 2 illustrates a simplified example of a radio frequency transmitter according to some examples of the present invention.

Referring now to FIG. 2, there is illustrated an example of an RF transmitter 200 adapted in accordance with some example embodiments of the present invention, such as may be implemented within the transmitter chain 107 of FIG. 1. The RF transmitter 200 of FIG. 2 comprises a digital signal processing module 210 arranged to receive one or more complex input signals comprising information to be transmitted over an RF interface, for example via antenna 102 of FIG. 1. In the illustrated example, the digital signal processing module 210 is arranged to receive from a digital baseband (DBB) component, such as the signal processing logic 108 of FIG. 1, an IQ (In-phase/Quadrature) input signal comprising a first (In-phase) signal component (i.e., I) 222 and a second (Quadrature) signal component (i.e., Q) 224. The digital signal processing module 210 is further arranged to perform mapping of the received complex input signal(s) 222, 224 to a first, in-phase, digital control word (IDPA_W) 212 and a second, quadrature, digital control word (QDPA_W) 214, and to output the in-phase and quadrature digital control words to power amplifier module, such as a two-dimensional digital power amplifier (2D-DPA) 230.

The power amplifier module 230 comprises a first (in-phase) array of switch-mode power cells and, in the illustrated example, a second (quadrature) array of switch-mode power cells, as described in greater detail below with reference to FIG. 5. The power amplifier module 230 is arranged to receive the digital control words output by the digital signal processing module 210, and to generate an analogue RF signal for transmission over an RF interface, for example via antenna 102, based at least partly on the received in-phase and quadrature digital control words.

In this manner, the RF transmitter 200 comprises a complex signal based architecture, for example an IQ based architecture, and as such is suitable for both narrowband and wideband modulation input signals. This is in contrast to, for example, a digital polar architecture which is only suitable for narrowband modulated signals due to the inherent bandwidth expansion characteristics of the AM (amplitude modulation) and PM (phase modulation) input signals of a polar architecture. Furthermore, such an IQ based architecture avoids the need for implementing complex algorithms, such as the CORDIC (Coordinate rotation digital computer) algorithm typically required for digital polar architectures. In addition, the RF transmitter 200 also extends the digital domain through to the power amplifier module 230, thereby benefiting from the scalability and efficiency of digital components to a greater extent than conventional RF architectures. Furthermore, the RF transmitter 200 illustrated in FIG. 2 takes advantage of the efficiency of switch-mode power cells.

Switch-mode power cells typically exhibit a highly non-linear input-output relationship, in particular when output power is high. Accordingly, the digital signal processing module 210 is arranged to perform two-dimensional non-uniform mapping of the input signals 222, 224 (as described in greater detail below) to the digital control words 212, 214. In this manner, the two-dimensional non-uniform mapping of the input signals 222, 224 provides pre-distortion of the input signals 222, 224, thereby enabling the non-linearity of the switch-mode power cells to be compensated for, also within the digital domain.

In some example embodiments of the present invention, digital pre-distortion is required to be performed with a sampling rate that is greater than that of the received complex input signal (for example in the region of three times that of the input signal) in order to preserve a certain spectrum at the output of the two-dimensional digital pre-distortion (2D DPD) component 250. Accordingly, the digital signal processing module 210 of the RF transmitter 200 of FIG. 2 comprises an up-sampling & filtering component 240 arranged to perform up-sampling of the received complex input signal 222, 224 to increase the sample rate thereof to, for example, an input data rate of the power amplifier module 230. In addition, for some example embodiments, the input to the power amplifier module 230 may comprise a 'sample and hold' operation. As such, so-called DAC images may be seen at the output of the power amplifier module 230 that are spaced from each other by the sampling frequency at the input of the power amplifier module 230. Accordingly, up-sampling of the input signal components 222, 224 may enable the spacing of such images to be increased.

The digital signal processing module 210 of the RF transmitter 200 of FIG. 2 further comprises a digital pre-distortion component 250 arranged to perform the non-uniform mapping of the up-sampled input signals (i.e., I_u and Q_u) 242, 244 to the digital control words 212, 214. The digital control words 212, 214 are output to one or more output ports 231 for coupling to one or more input ports of a power amplifier module 230.

Although the example of FIG. 2 is shown as comprising, say, a discrete integrated circuit comprising, at least, the signal processing module 210 that can be operably coupled to a distinct power amplifier module 230, it is envisaged in other examples that an integrated circuit may comprise the functionality of at least both the signal processing module 210 and the power amplifier module 230.

Figure 3:
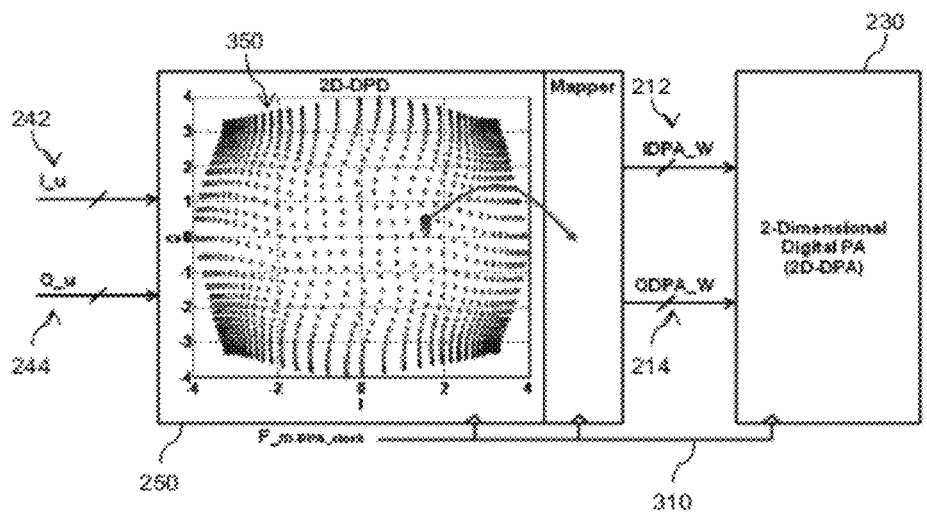
FIG. 3 illustrates a simplified example of a digital signal processing module of the radio frequency transmitter of FIG. 2.

For example, and as illustrated more clearly in FIG. 3, the digital signal processing module 210 may comprise a digital pre-distortion component 250 arranged to receive the up-sampled in-phase and quadrature components 242, 244 of the complex input signal, identify a closest matching pre-defined vector for the received complex input signal within a pre-distortion profile 350, and map the identified pre-defined vector to a set of digital control words to be output. Accordingly, the digital pre-distortion component 250 of the illustrated example is arranged to perform quantization and to simultaneously apply pre-distortion to the received up-sampled in-phase and quadrature components 242, 244 of the complex input signal using the pre-distortion profile 350. In some examples of the present invention, the pre-distortion profile 350 may be at least partly based on an input/output relationship for the power amplifier module 230, and in particular the pre-distortion profile 350 may be at least partly based on an input/output relationship for the switch-mode power cell arrays of the power amplifier module 230. In this manner, pre-distortion may be applied to the up-sampled input signals 242, 244 that compensates for power amplifier module characteristics (and in particular the non-linear switch-mode power cell characteristics).

For the example illustrated in FIGS. 2 and 3, the digital pre-distortion component 250 is implemented within a feed-forward path (as opposed to a feedback path). In this manner, the digital pre-distortion component 250 is able to directly compensate for the non-linearity of the power amplifier module 230 for each input sample. Such sample-by-sample digital pre-distortion is more accurate and responsive than digital pre-distortion that is averaged across multiple input samples within a feedback path.

As also illustrated in FIG. 3, by up-sampling the received complex input signal 222, 224 to increase the sample rate thereof to an input data rate of the power amplifier module 230, the digital pre-distortion module component 250 and power amplifier module 230 may be provided with a common clock signal 310.

Thus, for the example illustrated in FIG. 3, the digital signal processing module 210 is arranged to receive the complex (IQ) input signal 222, 224, up-sample and non-uniformly map the received signal to digital control words 212, 214 such that pre-distortion is applied to compensate for the non-linear characteristics of the power amplifier module 230, and to output digital control words 212, 214 to the power amplifier module 230, wherein the digital control words 212, 214 are arranged to drive the power amplifier module 230 to output an analogue RF signal that represents the up-sampled complex (IQ) input signal 242, 244. In particular, a pre-distortion profile 350 used for mapping the up-sampled input signal components 242, 244 to the digital control words 212, 214 may be at least partly based on the input/output relationship for the switch-mode power cell arrays of the power amplifier module 230 to adaptively compensate for the non-linearities of the switch-mode power cell arrays. Thus, the digital signal processing module 210 of the illustrated example provides two dimensional (IQ) digital pre-distortion functionality within a feed-forward path of the RF transmitter 200.

Figure 4:
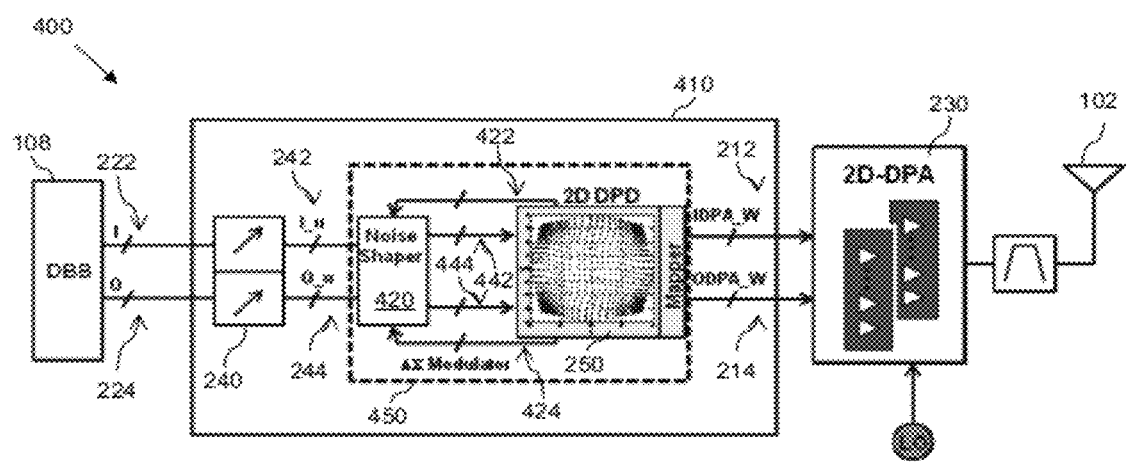
FIG. 4 illustrates a simplified alternative example of a radio frequency transmitter according to some examples of the present invention.

Referring now to FIG. 4 there is illustrated the RF transmitter 400 comprising an alternative example of a digital signal processing module 410 arranged to received from a digital baseband component, such as the signal processing logic 108 of FIG. 1, a complex (IQ) input signal 222, 224, perform mapping of the received complex input signal 222, 224 to digital control words 212, 214, and to output the digital control words 212, 214 to the power amplifier module 230. In particular for the illustrated example, the digital signal processing module 410 comprises an up-sampling component 240 arranged to perform up-sampling of the received complex input signal 222, 224 to increase the sample rate thereof to, for example, an input data rate of the power amplifier module 230. The digital processing module 410 further comprises a digital pre-distortion component 250 arranged to perform non-uniform mapping of the up-sampled input signals 242, 244 to the digital control words 212, 214.

The digital signal processing module 410 of FIG. 4 further comprises a noise shaping component/noise shaper 420. The noise shaping component 420 is arranged to receive the complex input signal, which for the illustrated example comprises the first (In-phase) and second (Quadrature) up-sampled signal components 242, 244, and one or more feedback signals 422, 424 from the digital pre-distortion component 250. The noise shaping component 420 is further arranged to apply noise shaping to the received complex input signal components 242, 244 based at least partly on the received feedback signals 422, 424, and to output to the digital pre-distortion component 250 the noise shaped input signal components 442, 444. In this manner, the digital pre-distortion component 250 is arranged to perform non-uniform mapping of the up-sampled noise shaped input signal components 442, 444 to the digital control words 212, 214.

In this manner, noise shaping of the complex input signal 222, 224 may be performed within the digital domain, and within the feed-forward path, prior to the non-uniform mapping to the digital control words 212, 214, enabling noise shaping to be maintained at the far-out region from the carrier, thus improving the spectrum at the desired far-out frequency band. In particular, it is contemplated that such noise shaping may be implemented through a configurable and/or programmable noise transfer function. In this manner, the RF transmitter may be configured and/or programmed to perform required noise shaping to meet stringent co-existence requirements of a plurality of different wireless standards.

As illustrated in FIG. 4, the noise shaping component 420 and digital pre-distortion component 250 may be arranged to form a delta-sigma modulator, as illustrated at 450. In this manner, the delta-sigma modulator 450 is arranged to receive the up-sampled complex (IQ) input signals 242, 244, and non-uniformly map the received signals to digital control words 212, 214 such that noise shaping and pre-distortion is applied to compensate for the non-linear characteristics of the power amplifier module 230, and to output digital control words 212, 214 to the power amplifier module 230, wherein the digital control words 212, 214 are arranged to drive the power amplifier module 230 to output an analogue RF signal that represents the up-sampled complex (IQ) input signal 242, 244. In particular, the aforementioned pre-distortion profile 350 used for mapping the up-sampled and noise shaped input signal components 242, 244 to the digital control words 212, 214 may be at least partly based on the input/output relationship for the switch-mode power cell arrays of the power amplifier module 230 to adaptively compensate for the non-linearities of the switch-mode power cell arrays.

Advantageously, the implementation of quantization and two-dimensional digital pre-distortion within the delta-sigma modulator 450 in this manner may result in any quantization noise being relative to the pre-distortion profile, thereby enabling noise shaping to be achieved. In contrast, were two-dimensional digital pre-distortion implemented after the delta-sigma modulator, the noise shaping effect would be at least partly washed-out by the non-linearity of the power amplifier module 230, and thus such noise shaping would not be seen at the output of the power amplifier module 230. This is due to the digital pre-distortion only being able to mitigate non-linearity at frequencies close to the signal; whereas noise shaping is often required at frequencies far away from the signal band.

Figure 5:
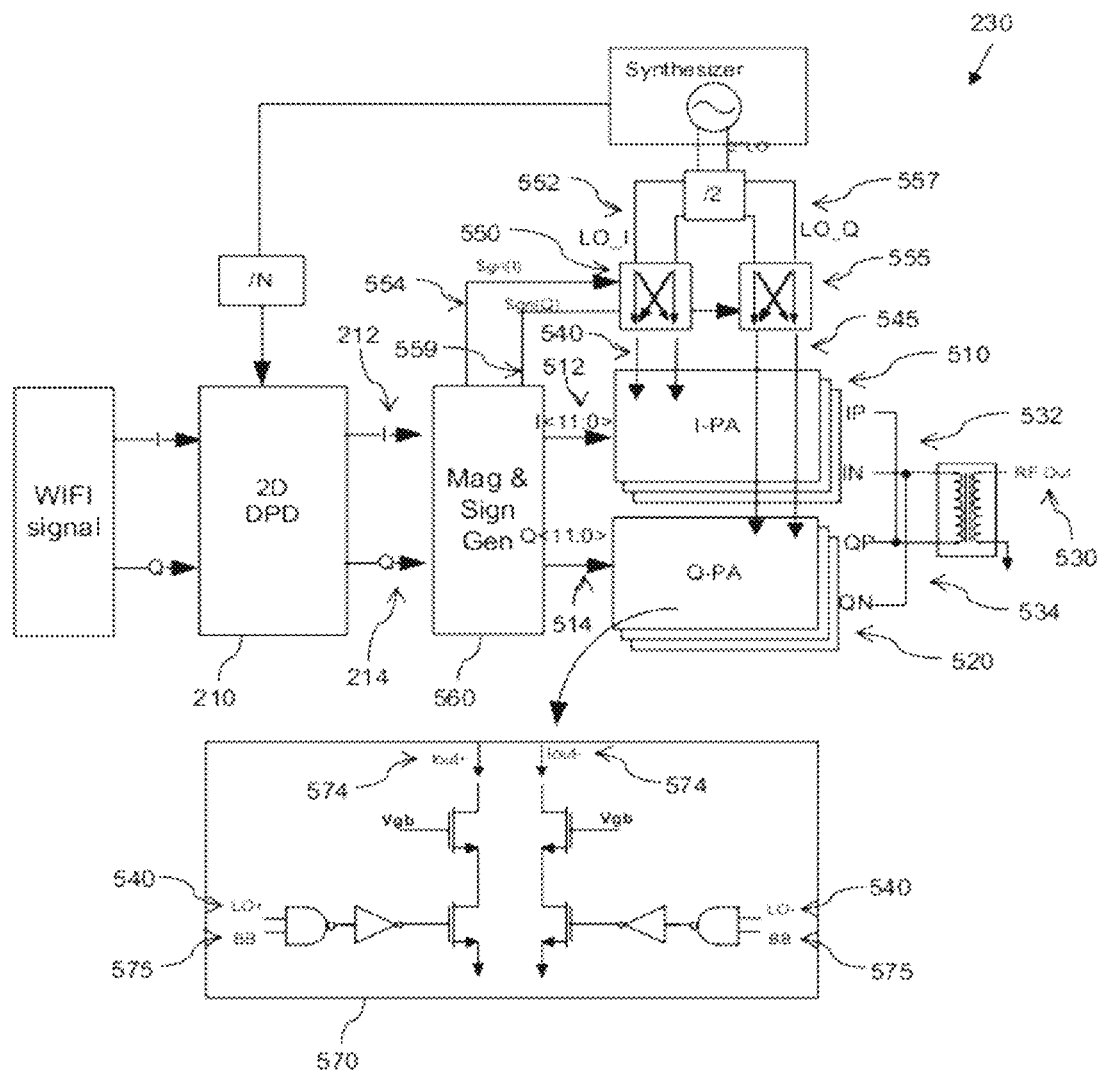
FIG. 5 illustrates a simplified block diagram of a power amplifier module of the radio frequency transmitter of FIG. 2 and/or FIG. 4.

Referring now to FIG. 5, there is illustrated a simplified diagram of an example of the power amplifier module 230 of FIG. 2. The power amplifier module 230 is arranged to receive the digital control words 212, 214 output by the digital signal processing module 210, and to output an analogue RF signal 530 for transmission over an RF interface, for example via the antenna 102 of FIG. 1, based at least partly on the received digital control words 212, 214. The power amplifier module 230 comprises a first array of switch-mode power cells (I-PA) 510 and, in the illustrated example, a second array of switch-mode power cells (Q-PA) 520. The first array of switch-mode power cells 510 is arranged to receive at least a part of the first (e.g. in-phase) digital control word 212 and to generate a first (e.g. in-phase) component 532 of the analogue RF signal 530 based at least partly on the received digital control word 212. Conversely, the second array of switch-mode power cells 520 is arranged to receive at least a part of the second (e.g. quadrature) digital control word 214 and to generate a second (e.g. quadrature) component 534 of the analogue RF signal 530 based at least partly on the received digital control word 214. The separate components 532, 534 are subsequently combined to generate the complex analogue RF signal 530.

In this manner, by providing multiple switch-mode power cell arrays 510, 520 arranged to receive separately the digital control words 212, 214 for the respective components of a multi-dimensional, e.g. complex (IQ), signal, and to separately generate the amplified components 532, 534 therefor (which may then be subsequently combined), a power amplifier module 230 is achieved that is capable of being digitally controlled to generate a multi-dimensional (e.g. IQ) amplified signal.

For some example embodiments, each of the arrays of switch-mode power cells 510, 520 may be arranged to receive at least a part of the respective digital control word 212, 214 comprising, say, N control bits. Furthermore, each of the arrays of switch-mode power cells 510, 520 may comprise N switch-mode power cells; each of the switch-mode power cells being arranged to receive a respective control bit of the respective digital control word 212, 214. An example of such a switch-mode power cell is illustrated at 570, which for the illustrated example comprises a high efficiency inverse Class D structure. Each of the switch-mode power cells 570 is arranged to receive a respective control bit, illustrated at 575, and to selectively output a current signal ($I_{out}+/I_{out}-$) 574 based on the value of the received control bit 575. The outputs of the switch-mode power cells 570 within each array 510, 520 are operably coupled together such that the individual power cell output current signals ($I_{out}+/I_{out}-$) 574 are combined to provide the respective component 532, 534 of the analogue RF signal 530. The output current signal ($I_{out}+/I_{out}-$) 574 for the individual switch-mode power cells 570 within each array 510, 520 may be weighted in accordance with the significance of their respective control bits. In this manner, the combined output current signal of each array 510, 520 may be representative of the value of the digital control word received thereby.

Advantageously, the power amplifier module 230 illustrated in FIG. 5 enables digital to analogue conversion functionality to be combined with power amplifier functionality, thereby simplifying the RF transmitter design. Furthermore, the provision of separate switch-mode power cell arrays 510, 520 to support the separate I and Q components of the complex IQ input signal enables the power amplifier module 230 to be suitable for both narrowband and wideband modulation input signals.

The switch-mode power cell arrays 510, 520 of the power amplifier module 230 illustrated in FIG. 5 are further arranged to receive respective carrier frequency signals 540, 545, and to generate the respective components 532, 534 of the analogue RF signal 530 further based at least partly on the received carrier frequency signals 540, 545. For example, the respective carrier frequency signal 540, 545 may be provided to each individual switch-mode power cell, such as illustrated at 540 within the illustrated power cell 570. In this manner, the power amplifier module 230 illustrated in FIG. 5 enables mixing functionality to also be combined with the power amplifier functionality and digital to analogue conversion functionality.

For the illustrated example, the power amplifier module 230 comprises a first (in-phase) phase selector 550 arranged to receive a first carrier frequency signal (LO_I) 552 and an in-phase sign signal 554, and to output an in-phase carrier frequency signal 540 for the first (in-phase) switch-mode power cell array 510 comprising a polarity based at least partly on the received in-phase sign signal 554. The power amplifier module 230 further comprises, for the illustrated example, a second (quadrature) phase selector 555 arranged to receive a second carrier frequency signal (LO_Q) 557 and a quadrature sign signal 559, and to output a quadrature carrier frequency signal 545 for the second (quadrature) switch-mode power cell array 520 comprising a polarity based at least partly on the received quadrature sign signal 559.

The power amplifier module 230 of the illustrated example further comprises a magnitude and sign generator module 560. The magnitude and sign generator module 560 is arranged to receive the digital control words 212, 214 output by the digital signal processing module 210, and from each of the digital control words 212, 214 generate a magnitude control word 512, 514, comprising a magnitude component of the respective digital control word 212, 214, and a sign signal 554, 559, comprising a sign component of the respective digital control word 212, 214. The magnitude control words 512, 514 are then provided to the respective switch-mode power cell arrays 510, 520, and the sign signals 554, 559 are provided to the respective phase selectors 550, 555. In this manner, the sign and magnitude of the in-phase and quadrature signal components may be separated to facilitate the use of switch-mode power cells.

Advantageously, because the digital domain extends through to the power amplifier module 230, there is no need for a linear pre-driver amplifier or baseband filter. Furthermore, the use of digitally controlled power cells enables the power consumption of the power amplifier module 230 to be scalable to substantially instantaneous RF output power.

The output impedance of the power amplifier module 230 is a function of signal power level (i.e. compression). Accordingly, the effective load for each switch-mode power cell array 510, 520 will comprise a combination of the load present on the output signal 530 and the output impedance of the opposing switch-mode power cell array 510, 520. For example, the effective load for the first (in-phase) power cell array 510 will comprise a combination of the load present on the output signal 530 and the output impedance of the second (quadrature) power cell array 520. Thus, the effective load of the first (in-phase) switch-mode power cell array 510 is a function of the Q-channel power level, and the effective load of the second (quadrature) switch-mode power cell array 520 is a function of the I-channel power level. Accordingly, the non-linear characteristics of the power amplifier module 230 for the illustrated example are not solely a function of the complex signal power ($|I|^2+|Q|^2$), but are also dependant on the in-phase and quadrature digital control words provided to the power amplifier module 230. Thus, whilst AM-AM and/or AM-PM correction is typically sufficient for a convention power amplifier arrangement with short memory, two dimensional pre-distortion is required for compensating for the non-linear characteristics of such a digital power amplifier module 230, such as provided by the digital signal processing modules illustrated in FIGS. 2 and 4.

Figure 6:
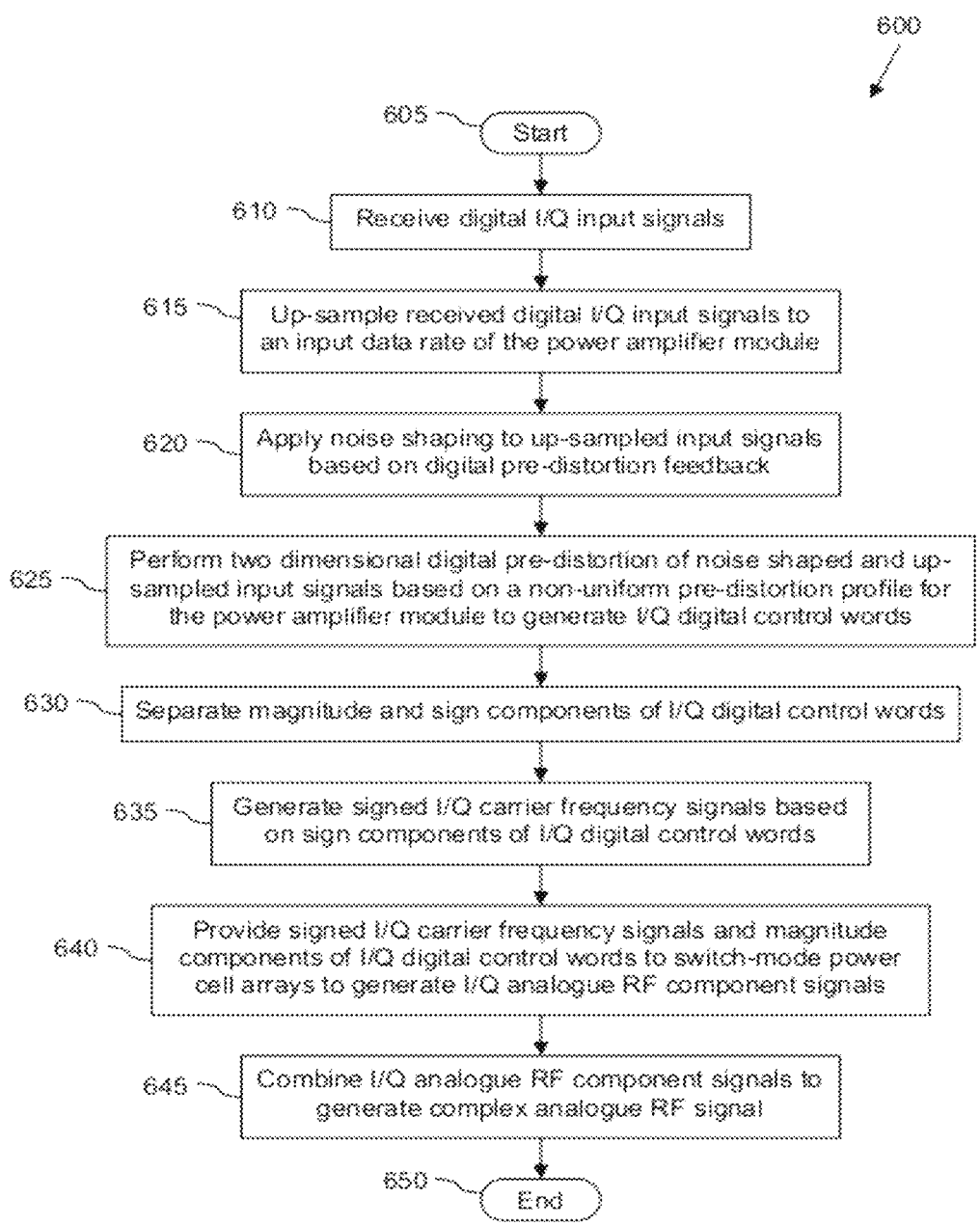
FIG. 6 illustrates a simplified flowchart of an example of a method for generating an analogue RF signal for transmission over an RF interface according to some embodiments of the present invention.

Referring now to FIG. 6, there is illustrated a simplified flowchart 600 of an example of a method for generating an analogue RF signal for transmission over an RF interface. The method of FIG. 6 starts at step 605, and moves on to step 610 with the receipt of digital in-phase and quadrature input signals comprising information to be transmitted over the RF interface. Next, at step 615, the received input signals are up-sampled to an input data rate of a power amplifier module. Noise shaping is then applied to the up-sampled input signals, at 620, based on feedback from a subsequent digital pre-distortion stage (at step 625). Two dimensional digital pre-distortion of the noise shaped, up-sampled input signals is then performed based on a non-uniform pre-distortion profile for the power amplifier module to generate in-phase and quadrature digital control words, at step 625. Next, at step 630, magnitude and sign components of the in-phase and quadrature control words are then separated, and signed in-phase and quadrature carrier frequency signals are then generated, at step 635, based (at least partly) on the respective sign components of the in-phase and quadrature control words. The magnitude components of the in-phase and quadrature control words and the signed in-phase and quadrature carrier frequency signals are then provided to respective in-phase and quadrature switch-mode power cell arrays, at step 640, to generate in-phase and quadrature analogue RF component signals. The in-phase and quadrature analogue RF component signals are then combined at step 645 to generate a complex analogue RF signal comprising the information to be transmitted over the RF interface, and the method ends at step 650.

The illustrated example embodiments of the present invention have, for the most part, been implemented using electronic components and circuits known to those skilled in the art. Accordingly, details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an', limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency (RF) transmitter comprising:
at least one digital signal processing module comprising:
at least one noise shaping component and at least one digital pre-distortion component, wherein the at least one noise shaping component is arranged to:
receive at least one complex input signal,
receive at least one feedback signal from the at least one digital pre-distortion component,
apply noise-shaping to the at least one complex input signal based at least partly on the at least one feedback signal, and
output at least one noise shaped complex input signal; and
wherein the at least one digital pre-distortion component is arranged to:
receive the at least one noise-shaped complex input signal comprising information to be transmitted over an RF interface,
perform two-dimensional non-uniform mapping of the at least one received noise-shaped complex input signal to a first, in-phase digital pre-distortion control word and a further, quadrature digital pre-distortion control word, and
output the in-phase and quadrature digital pre-distortion control words; and
at least one power amplifier module comprising a digital power amplifier (DPA) having a first, in-phase, array of switch-mode power cells and at least one further, quadrature, array of switch-mode power cells, wherein the first, in-phase digital pre-distortion control word and further, quadrature digital pre-distortion control word are arranged to drive the at least one power amplifier module to output an analog RF signal that represents the at least one noise-shaped complex input signal, and wherein two-dimensional non-uniform mapping comprises a pre-distortion profile that is generated at least partly according to an input/output relationship of the arrays of the switch mode power cells of the DPA to compensate non-linearities of the switch-mode power cells, wherein each of the switch-mode power cells is arranged to:
receive the in-phase and quadrature digital pre-distortion control words output by the at least one digital signal processing module, and
generate the analog RF signal for transmission over the RF interface based at least partly on the in-phase and quadrature digital pre-distortion control words.

2. The RF transmitter of claim 1 wherein the at least one digital pre-distortion component is arranged to:
identify a closest matching predefined vector for the received noise-shaped complex input signal within the pre-distortion profile; and
map the identified closest matching predefined vector to a set of digital control words to be output.

3. The RF transmitter of claim 1 wherein the at least one noise shaping component and the at least one digital pre-distortion component form at least part of a delta sigma modulator.

4. The RF transmitter of claim 1 wherein the at least one digital signal processing module comprises an up-sampling component arranged to perform up-sampling of the received at least one complex input signal thereby increasing a sample rate of the received at least one complex input signal to an input data rate of the DPA.

5. The RF transmitter of claim 1 wherein:
the first array of switch-mode power cells is arranged to receive at least a part of the first, in-phase digital control word and to generate a first, in-phase, component of the analog RF signal based at least partly on the first, in-phase, digital control word; and
the at least one further array of switch-mode power cells is arranged to receive the at least one further, quadrature, digital control word and to generate at least one further, quadrature, component of the analog RF signal based at least partly on the at least one further, quadrature, digital control word.

6. The RF transmitter of claim 5 wherein the first, in-phase, array of switch-mode power cells and at least one further, quadrature, array of switch-mode power cells are further arranged to receive respective carrier frequency signals, and to generate the respective in-phase and quadrature components of the analog RF signal further based at least partly on the received carrier frequency signals.

7. The RF transmitter of claim 6 wherein the at least one power amplifier module comprises
a first, in-phase, phase selector arranged to receive a carrier frequency signal and a first, in-phase, sign signal, and to output a first, in-phase, carrier frequency signal for the first, in-phase, array of switch-mode power cells; and
at least one further, quadrature, phase selector arranged to receive the carrier frequency signal and at least one further, quadrature, sign signal, and to output at least one further, quadrature, carrier frequency signal for the at least one further, quadrature, array of switch-mode power cells.

8. The RF transmitter of claim 1 wherein the at least one power amplifier module comprises a magnitude and sign generator module arranged to:
directly receive the digital pre-distortion control words output by the digital signal processing module; and
generate from each digital pre-distortion control word a magnitude control word comprising a magnitude component of the respective digital pre-distortion control word, and a sign signal comprising a sign component of the respective digital pre-distortion control word.

9. The RF transmitter of claim 1 wherein each array of switch-mode power cells comprises a plurality of inverse Class D structure switch-mode power cells.

10. An integrated circuit device comprising:
at least one digital signal processing module comprising:
at least one noise shaping component and at least one digital pre-distortion component, wherein the at least one noise shaping component is arranged to:
receive at least one complex input signal,
receive at least one feedback signal from the at least one digital pre-distortion component,
apply noise-shaping to the at least one complex input signal based at least partly on the at least one feedback signal, and
output at least one noise-shaped complex input signal; and
wherein the at least one digital pre-distortion component is arranged to:
receive at least one noise-shaped complex input signal comprising information to be transmitted over a radio frequency (RF) interface,
perform two-dimensional non-uniform mapping of the at least one received noise-shaped complex input signal to a first, in-phase digital pre-distortion control word and at least one further, quadrature digital pre-distortion control word, and
an output port arranged to output the in-phase and quadrature digital pre-distortion control words to at least one power amplifier module comprising a digital power amplifier, DPA, having a first, in-phase, array of switch-mode power cells and at least one further, quadrature, array of switch-mode power cells, wherein the first, in-phase digital pre-distortion control word and further, quadrature digital pre-distortion control word are arranged to drive the at least one power amplifier module to output an analog RF signal that represents the at least one complex input signal, and wherein two-dimensional non-uniform mapping comprising a pre-distortion profile that is generated at least partly according to an input/output relationship of the arrays of the switch mode power cells of the DPA to compensate non-linearities of the switch-mode power cells, wherein each of the switch-mode power cells is arranged to receive the in-phase and quadrature digital pre-distortion control words output by the at least one digital signal processing module,
such that a combined output of the switch-mode power cells produces the analog RF signal for transmission based at least partly on the in-phase and quadrature digital pre-distortion control words.

11. The integrated circuit device of claim 10 wherein the at least one digital pre-distortion component is arranged to:
identify a closest matching predefined vector for the received noise-shaped complex input signal within the pre-distortion profile; and
map the identified closest matching predefined vector to a set of digital control words to be output.

12. The integrated circuit device of claim 10 wherein:
the first array of switch-mode power cells is arranged to receive at least a part of the first, in-phase digital control word and to generate a first, in-phase, component of the analog RF signal based at least partly on the first, in-phase, digital control word; and
the at least one further array of switch-mode power cells is arranged to receive the at least one further, quadrature, digital control word and to generate at least one further, quadrature, component of the analog RF signal based at least partly on the at least one further, quadrature, digital control word.

13. The integrated circuit device of claim 10 wherein the at least one power amplifier module comprises a magnitude and sign generator module arranged to:
directly receive the digital pre-distortion control words output by the digital signal processing module; and
generate from each digital pre-distortion control word a magnitude control word comprising a magnitude component of the respective digital pre-distortion control word, and a sign signal comprising a sign component of the respective digital pre-distortion control word.

14. A wireless communication unit comprising a radio frequency (RF) transmitter comprising:

at least one digital signal processing module comprising:
at least one digital signal processing module comprising:
at least one noise shaping component and at least one digital pre-distortion component, wherein the at least one noise shaping component is arranged to:
receive at least one complex input signal,
receive at least one feedback signal from the at least one digital pre-distortion component,
apply noise-shaping to the at least one complex input signal based at least partly on the at least one feedback signal, and
output at least one noise shaped complex input signal; and
wherein the at least one digital pre-distortion component is arranged to:
receive the at least one noise-shaped complex input signal comprising information to be transmitted over an RF interface,
perform two-dimensional non-uniform mapping of the at least one received noise-shaped complex input signal to a first, in-phase digital control pre-distortion word and a further quadrature digital pre-distortion control word, and
output the in-phase and quadrature digital pre-distortion control words; and
at least one power amplifier module comprising a digital power amplifier, DPA, having a first, in-phase, array of switch-mode power cells and at least one further, quadrature, array of switch-mode power cells,
wherein the first, in-phase digital pre-distortion control word and further, quadrature digital pre-distortion control word are arranged to drive the at least one power amplifier module to output an analog RF signal that represents the at least one complex input signal, and wherein two-dimensional non-uniform mapping comprises a pre-distortion profile that is generated at least partly according to an input/output relationship of the arrays of the switch mode power cells of the DPA to compensate non-linearities of the switch-mode power cells, wherein each of the switch-mode power cells is arranged to:
receive the in-phase and quadrature digital pre-distortion control words output by the at least one digital signal processing module,
such that a combined output of the switch-mode power cells produces the analog RF signal for transmission over the RF interface based at least partly on the in-phase and quadrature digital pre-distortion control words.

15. A method of generating a radio frequency signal for transmission over a radio frequency (RF) interface, the method comprising:
receiving at least one complex input signal comprising information to be transmitted over the RF interface;
receiving at least one feedback signal from at least one digital pre-distortion component;
applying noise shaping to the at least one complex input signal based at least partly on the at least one feedback signal; and
outputting at least one noise-shaped complex input signal;
performing two-dimensional non-uniform mapping of the at least one received noise-shaped complex input signal to a first, in-phase, digital pre-distortion control word and at least one further, quadrature, digital pre-distortion control word;
providing the in-phase and quadrature digital pre-distortion control words to at least one power amplifier module comprising a digital power amplifier, DPA, having a first, in-phase, array of switch-mode power cells and at least one further, quadrature, array of switch-mode power cells;
wherein the first, in-phase digital pre-distortion control word and further, quadrature digital pre-distortion control word are arranged to drive the at least one power amplifier module to output an analog RF signal that represents the at least one complex input signal, and wherein two-dimensional non-uniform mapping comprises a pre-distortion profile that is generated at least partly according to an input/output relationship of the arrays of the switch mode power cells of the DPA to compensate non-linearities of the switch-mode power cells;
receiving the in-phase and quadrature digital pre-distortion control words output by the at least one digital signal processing module, and
combining an output of the switch-mode power cells;
producing the analog RF signal for transmission over the RF interface from the combined output of the switch-mode power cells based at least partly on the in-phase and quadrature digital pre-distortion control words.

16. The method of claim 15 further comprising:
identifying a closest matching predefined vector for the received complex input signal within the pre-distortion profile; and
mapping the identified closest matching predefined vector to a set of digital control words to be output.

17. The method of claim 15 further comprising:
performing up-sampling of the received at least one complex input signal thereby increasing a sample rate of the received at least one complex input signal to an input data rate of the at least one power amplifier module.

18. The method of claim 15 wherein the step of generating an analog RF signal comprises:
the first array of switch-mode power cells receiving at least a part of the first, in-phase digital control word and generating a first, in-phase, component of the analog RF signal based at least partly on the first, in-phase, digital control word; and
the at least one further array of switch-mode power cells receiving the at least one further, quadrature, digital control word and generating at least one further, quadrature, component of the analog RF signal based at least partly on the at least one further, quadrature, digital control word.

19. The method of claim 15 further comprising:
directly receiving the digital pre-distortion control words; and
generating from each digital pre-distortion control word a magnitude control word comprising a magnitude component of the respective digital pre-distortion control word, and a sign signal comprising a sign component of the respective digital pre-distortion control word.

* * * * *